United States Patent [19]

Hayashi

[11] Patent Number: 4,741,041
[45] Date of Patent: Apr. 26, 1988

[54] APPARATUS FOR SHIELDING AUDIO SIGNAL CIRCUIT

[75] Inventor: Naotake Hayashi, Tokyo, Japan

[73] Assignee: Stax Industries Limited, Tokyo, Japan

[21] Appl. No.: 776,052

[22] PCT Filed: Dec. 28, 1984

[86] PCT No.: PCT/JP84/00632

§ 371 Date: Aug. 29, 1985

§ 102(e) Date: Aug. 29, 1985

[87] PCT Pub. No.: WO85/03187

PCT Pub. Date: Jul. 18, 1985

[30] Foreign Application Priority Data

Dec. 29, 1983 [JP] Japan .................. 58-252058

[51] Int. Cl.$^4$ ........................... H04R 3/00
[52] U.S. Cl. ........................... 381/122; 381/168
[58] Field of Search ........ 174/36, 35 CE, 102 R, 174/102 SP; 381/122, 124, 88, 91, 174, 168; 333/237

[56] References Cited

U.S. PATENT DOCUMENTS

| | | | |
|---|---|---|---|
| 1,370,731 | 3/1921 | Chase | 174/35 CE |
| 2,433,181 | 12/1947 | White | 174/35 CE |
| 2,515,333 | 7/1950 | Buffington | 174/35 CE |
| 2,718,542 | 9/1955 | Lapsley | 174/35 CE |
| 3,291,891 | 12/1966 | Sharp | 174/36 |
| 4,365,109 | 12/1982 | O'Loughlin | 174/36 |

FOREIGN PATENT DOCUMENTS

| | | |
|---|---|---|
| 2358170 | 5/1975 | Fed. Rep. of Germany ... 174/35 CE |
| 044069 | 4/1929 | Japan . |
| 40-13043 | 5/1965 | Japan . |
| 47-10909 | 4/1972 | Japan . |
| 48-14588 | 4/1973 | Japan . |
| 50-40576 | 12/1975 | Japan ............................ 174/35 CE |
| 53-14908 | 4/1978 | Japan . |
| 463676 | 4/1937 | United Kingdom ........... 174/35 CE |

*Primary Examiner*—Forester W. Isen
*Attorney, Agent, or Firm*—Sughrue, Mion, Zinn, Macpeak, and Seas

[57] ABSTRACT

An apparatus for shielding an audio signal circuit is disclosed, which comprises a shielding member (13, 21, 31, 41, 42) surrounding a signal conductor (11). According to the present invention, the shielding member has an electrically discontinuous portion so as not to form a closed circuit within the cross section of the signal conductor (11). It is thus possible to prevent the signal current flowing through the signal conductor (11) from inducing a secondary current in the shielding member, without impairing the properties of the shielding member by which the signal conductor (11) is effectively shielded against any external electromagnetic field.

2 Claims, 2 Drawing Sheets

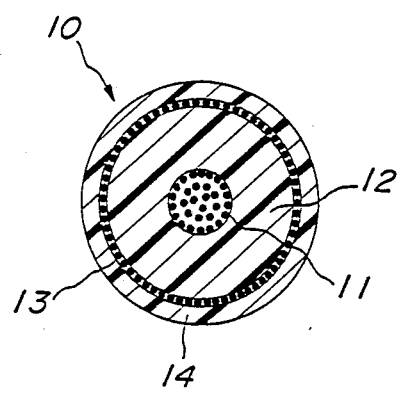
FIG_1a
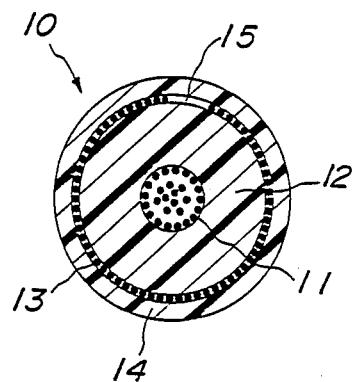
FIG_1b
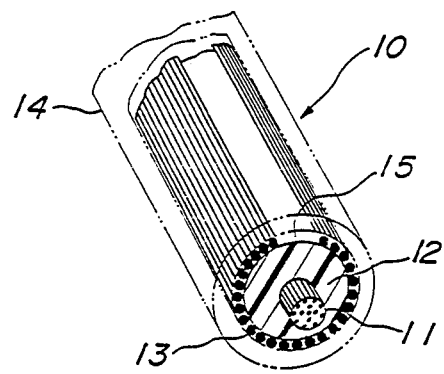
FIG_1c

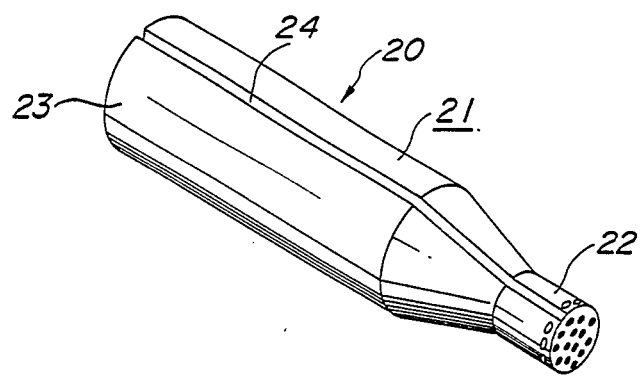
FIG_2
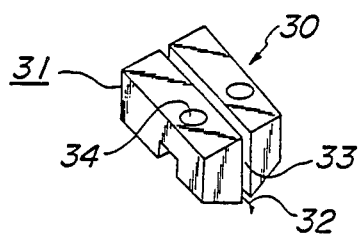
FIG_3
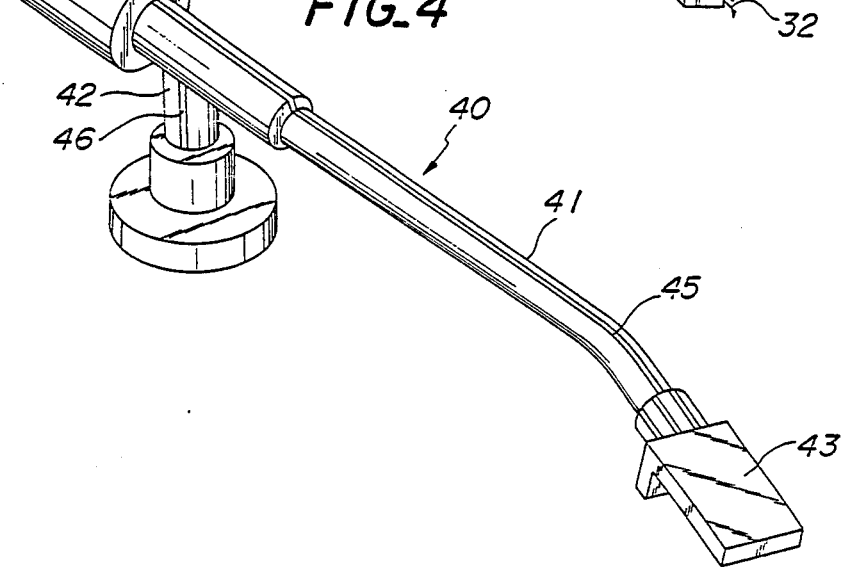
FIG_4

APPARATUS FOR SHIELDING AUDIO SIGNAL CIRCUIT

TECHNICAL FIELD

The present invention relates to an apparatus for shielding an audio signal circuit.

BACKGROUND OF THE INVENTION

With a recent significant improvement in the reproduced sound quality of audio equipment, a large power supply circuit, which was once regarded to be of poor economy and technically disadvantageous, has once again been taken into account for audio equipment. The introduction of high-quality wire material, particularly oxygen-free copper wire, linear-large-crystal oxygen-free copper wire and the like, for a signal conductor of audio signal circuits, has come to be recognized as indispensable. Even when most of the generally known methods of improving the sound quality, as described above, are adopted, however, it is pointed out not only by those skilled in the art but also by a number of enthusiastic users, that there still remains a delicate difference between the original sound and the reproduced sound, which difference can be discriminated by the human ear.

Generally, in order to further improve the reproduced sound quality, various attempts have hitherto been made with respect mainly to the material used in the signal circuits of audio equipment, as described above. In addition, to prevent a signal current flowing through a signal conductor from being adversely affected by an external electromagnetic field, it has been considered that the signal conductor should be shielded as completely as possible by means of a shielding member. On the other hand, as far as the inventor knows, the fact that undesirable influences, such as increase in the distortion of the signal current, are caused by the shielding member has not been completely recognized, and therefore, no particular attention has been paid to eliminate the undesirable influences.

If it is assumed to be possible to practically neglect the undesirable influences caused by the external electromagnetic field, then it is obvious that the shield member can be dispensed with, and a bare signal conductor can be used. However, such a use environment is quite uncommon and extraordinary. Consequently, provision of a shielding member for the signal conductor of domestic-use audio equipment has been regarded as being indispensable.

DISCLOSURE OF THE INVENTION

The present invention is based on a practical recognition obtained as a result of a thorough investigation, which has been carried out with respect to the structure of the shielding member to be provided for a signal conductor, without prejudice of general knowledge. More particularly, the inventor has made a careful consideration on the mechanism whereby the shielding member affects the signal current, and concluded as follows. Namely, when a signal current flows through a signal conductor an electromagnetic field is formed around the circumference thereof, a secondary current is induced in the shielding member surrounding the signal conductor as a closed circuit within the cross section thereof. A secondary electromagnetic field is formed by the secondary current, in response to which a current is induced within the signal conductor and superimposed on the signal current. The induced current causes distortion, noise, and the like, to appear in the signal current, significantly impairing high-fidelity. On the basis of such a recognition, a trial has been made therein the shielding member in the cross section of the signal conductor is arranged so that a non-closed, discontinuous circuit is formed, except for locally closed circuit, which resulted in a complete elimination of the undesirable influence of the signal current caused by itself through the shielding member, while at the same time sufficiently maintaining the required shielding effect against the external electromagnetic field. Accordingly, the present invention is characterized in that a shielding member has an electrically discontinuous portion, and is provided outside a signal conductor for an audio signal circuit so as not to form a closed circuit within the cross section of the signal conductor.

BRIEF DESCRIPTION OF THE DRAWINGS

FIGS. 1a is an end view of a conventional shield cable;

FIGS. 1b and 1c are an end view and a perspective view of the shield cable according to one embodiment of the present invention;

FIG. 2 is a perspective view of a microphone according to another embodiment of the present invention;

FIG. 3 is a perspective view of a pickup cartridge according to another embodiment of the present invention; and FIG. 4 is a perspective view of a tone arm according to another embodiment of the present invention.

BEST MODE OF CARRYING OUT THE INVENTION

The present invention will now be described with reference to the drawings.

FIG. 1a illustrates a conventional shield cable. The shield cable 10 includes a signal conductor 11 which is covered by an insulating material 12. Also included are shielding wires 13 which are arranged on the circumference of the insulating material 12 in parallel with the axis of the shield cable 10. The shielding wires 13 are covered by a further insulating material 14. In applying the present invention to such a shield cable, as shown in FIGS. 1b and 1c, the shield cable is arranged such that the shielding wires 13 define, in the circumferential direction, at least one slit-like, discontinuous portion 15 extending in the longitudinal direction thereof, so as to form an electrically discontinuous circuit within the cross section of the signal conductor 11. In this case, in view of production technology, it is desirable that the shielding wires be arranged in parallel with the axial direction of the cable 10, as shown in FIG. 1c, or they be wound helically with respect to the axis of the cable 10 and in parallel with each other without forming a mesh structure.

FIG. 2 shows an electrostatic-type microphone according to another embodiment of the present invention. The microphone 20 has a capsule 21 with a small-diameter end portion 22 accommodating therein an electro-acoustic transducer in the form of a diaphragm, and with a large-diameter end portion 23 accommodating therein an impedance converter in the form of an amplifier. The internal wiring and circuit elements of the microphone 20 are shielded by the capsule 21 itself, which functions as a shielding member. According to the present invention, a slit 24 is formed on the periphery of the capsule 21 and extends in the longitudinal direction, and thus the cross section of the capsule 21 is made to be discontinuous in the circumferential direction. According to such an arrangement, the wiring and circuit elements within the capsule 21 are surrounded by a shielding member which has an electrically discontinuous cross section and is formed by the capsule itself.

FIG. 3 shows a pickup cartridge used for disc record reproduction, according to another embodiment of this invention. The cartridge is, for example, of an electrostatic-type, or of an electromagnetic-type, and has a casing 31 as a shielding member, which accommodates therein a transducer element for transducing mechanical vibration, obtained from the record grooves, into electrical oscillation. A stylus 32 is supported by a cantilever member arranged so as to protrude from the casing 31. A slit 33 is formed along the longitudinal center portion of the casing 31, so that the transducer element and internal wirings are surrounded by the casing 31 with an electrically discontinuous cross section. Reference numeral 34 denotes holes for passing therethrough bolts for attaching the cartridge 30 to a cartridge shell.

FIG. 4 illustrates a tone arm for a record player, according to another embodiment of the present invention. The tone arm 40 has a tube 41 and a bearing portion 42, with a cartridge shell 43 attached to one end of the tube 41 and a balance weight 44 attached to the other end thereof. The tube 41 and the bearing portion 42 contain wirings as signal conductors. According to this invention, slits 45 and 46, extending in the longitudinal direction, are formed respectively on the circumference of the tube 41 and the bearing portion 42, and the internal wirings are shielded by the pipe 41 and the bearing portion 42 electrically discontinuously with respect to each cross section.

In the embodiments shown in FIGS. 2 to 4, with an object to preserve the mechanical rigidity, the slits 24, 33, 45 and 46 may be filled with a synthetic resin, such as epoxy resin, having electrically insulating characteristic, and the synthetic resin may be colored corresponding to the color of the other material as required.

The present invention is not limited to the above-described embodiments only, and may be applied to the following objects:

(1) transformer, inductor, capacitor, volume control resistor, power transistor, amplifier, and shield casing for audio/video circuit of video equipment;

(2) connector body;

(3) capacitor body;

(4) metal cap attached to both ends of a small fixed resistor having a helical resistance element; and (5) cylindrical electrode of a dry battery.

In order to confirm the effect of the present invention, a sound-quality evaluation examination according to blind-test method has been carried out by an audience, with a reproduction system including equipment which will be described hereinafter. An analog LP disc record was used as a sound source, on which is recorded music representing a non-stationary sound with its upper limit frequency sufficiently exceeding the audible limit frequency (about 20 KHz). The pickup was of the electrostatic-type with a slit formed in the casing, as shown in FIG. 3. The pickup was attached to the tone arm with its tube and bearing portion formed with slitss, as shown in FIG. 4, and was connected to a direct current amplifier by using a shield cable having shielding wires with a slit-like discontinuous portion, as shown in FIGS. 1b and 1c, and a signal conductor consisting of linear-large-crystal oxygen-free copper wire, as well as a connector having a slit in its body. The present invention has been applied as extensively as possible, to a shield casing for main circuit elements of the amplifier, having a capacity to effect the reproduction at an upper limit frequency which exceeds 200 KHz. Using this amplifier and an electrostatic-type headphone with a reproducible upper limit frequency greater than 100 KHz and an extremely thin diaphragm, 0.5 $\mu$m in thickness, the reproduced sound of the above-mentioned disc record was been listened to. According to the results of the comparison between such reproduced sound and the sound reproduced using conventional system, the sound reproduced by the system according to the present invention was found to be enriched in the low frequency range and no impurity and unclearness in the medium and high frequency ranges have been recognized. This made it possible to clearly hear conventionally insensible sounds, and resulted in a significant improvement in the reproduced sound quality. As to whether the sound quality has been refined or not, with respect to audio equipments, its correlation to the measured data is not clear because the difference in the sound quality is at the microlevel that is impossible to measure by conventional measuring devices. However, since the improvement in sound quality has actually been recognized by the audience as a result of the blind test, the advantageous effect of the present invention is believed to meet with objective recognition. More particularly, the present invention makes it possible to sufficiently shield the signal path of audio equipment and, at the same time, eliminate the above-mentioned undesirable influences induced by the signal current itself, accompanying an increase in the dynamic range, enlargement of the reproduction frequency range, and an improvement in the articulation.

I claim:

1. An apparatus for shielding an audio signal circuit, including a shielding member (21, 31, 41,42) which surrounds a signal conductor of said audio signal circuit, said shielding member (21, 31, 41, 42) comprising; a casing with an electrically discontinuous portion (24, 33, 45, 46) arranged to prevent formation of a closed circuit within the cross section of said signal conductor wherein said casing of said shielding member comprises a capsule (21) of a microphone (20) having therein electro-acoustic tranducing means and impedance converting means for an output of said tranducing means, said said capsule (21) having a discontinuous cross section formed by at least one slit (24) extending in the longitudinal direction on the circumference thereof.

2. An apparatus as claimed in claim 1, characterized in that said slit (24, 33, 45, 46) is filled with a synthetic resin having an electrically insulating characteristic.

* * * * *